United States Patent [19]

Chang et al.

[11] Patent Number: 5,275,695

[45] Date of Patent: Jan. 4, 1994

[54] PROCESS FOR GENERATING BEVELED EDGES

[75] Inventors: Lucas S. Chang, San Jose; Jerome M. Eldridge, Los Gatos; Cherngye Hwang, San Jose; James H. Lee, San Jose; Tiee-Ghow Wang, San Jose, all of Calif.

[73] Assignee: International Business Machines Corporation, Armonk, N.Y.

[21] Appl. No.: 993,197

[22] Filed: Dec. 18, 1992

[51] Int. Cl.⁵ .................. B44C 1/22; C23F 1/00
[52] U.S. Cl. .................. 156/661.1; 156/656; 156/904
[58] Field of Search ............ 156/626, 644, 656, 659.1, 156/661.1, 665, 666, 904, 668; 430/312, 313, 318, 323

[56] References Cited

U.S. PATENT DOCUMENTS

| | | | |
|---|---|---|---|
| 4,092,210 | 5/1978 | Hoepfner | 156/643 |
| 4,484,978 | 11/1984 | Keyser | 156/643 |
| 4,635,090 | 1/1987 | Tamaki et al. | 357/50 |
| 4,919,748 | 4/1990 | Bredbenner et al. | 156/665 X |
| 4,938,841 | 7/1990 | Shahar et al. | 156/661.1 |
| 4,944,831 | 7/1990 | Sibuet | 156/661.1 |
| 5,174,857 | 12/1992 | Sung | 156/904 X |

OTHER PUBLICATIONS

R. G. Brandes et al., Wall Profiles Produced During Photoresist Masked Isotropic Etching, J. Electrochem. Soc.: Solid-State Science and Technology, pp. 140-142, Jan. 1973.

J. L. Vossen et al., Processes for Multilever Metallization, J. Vac. Sci. Technol., vol. 11, No. 1 Jan./Feb. 1974, pp. 60-70.

O. J. Wimmers et al., Taper Etching of an Amorphous Soft Magnetic CoNbZr Alloy Using an Interfacial Organosilane Layer, Journal of the Electrochemical Society, vol. 136, No. 6, Jun. 1989, pp. 1769-1772.

J. J. Kelley et al., Electrochmeical Aspects of the Beveling of Sputtered Permalloy Films, J. Electrochem. Soc.; Electrochemical Science and Technology, vol. 125, No. 6, pp. 860p-865, Jun. 1978.

D. C. Cosman et al., Solution for Etching Aluminum Metallurgy, IBM Tech. Disclosure Bulletin, vol. 13, No. 5, pp. 1309-1310, Oct. 1970.

R. C. T. Turnbull, Tapering Metallurgy Edges, IBM Tech. Disclosure Bulletin, vol. 15, No. 5, p. 1620, Oct. 1972.

*Primary Examiner*—William A. Powell
*Attorney, Agent, or Firm*—Lucas S. Chang

[57] ABSTRACT

Improved processes for generating a structure having beveled edges are presented. In a preferred embodiment, two photoresist layers are successively deposited on top of the target material, e.g., a metallization film. The intermediate photoresist layer is developed beyond the lithographically delineated boundaries of the top photoresist layer, forming deep recesses. These recesses remain unchanged during the subsequent etching step, resulting in pre-defined edge profiles in the target material.

19 Claims, 4 Drawing Sheets

PROCESS FOR GENERATING BEVELED EDGES

FIELD OF THE INVENTION

This invention generally relates to lithographically defined etching, and more particularly, to novel resist mask systems and wet etching techniques producing a thin-film or substrate structure having a pre-defined edge profile, e.g., a gradual slope.

DESCRIPTION OF THE PRIOR ART

Fabrication of electronic components and thin film devices involves a number of photolithographic steps. The exact processing conditions and materials used in such steps determine the contours of the edges of photolithographically delineated structures. Although very steep or even vertical edges are acceptable for some applications, gradually graded or tapered edge contours are usually more desirable. This is particularly true if: subsequently deposited layers must cover the previously patterned layer; high electrical fields due to sharp edges must be avoided; or, a slope with a specific contour must be achieved to serve as a particular device, e.g., a waveguide structure on optical integrated circuits. Thus, producing an edge with a gradually varying depth, or a "beveled" edge having a well-defined sloping angle or edge profile, has been a desirable objective for a variety of technological areas including thermal printing devices, semiconductor and magnetic storage devices, flat panel displays, etc.

Recently, thermal ink jet printing has begun to replace other impact and non-impact printing methods as the technology of choice for low-end printing and for full-color printing. A thin-film thermal ink jet printhead comprises several layers of resistive, conductive and dielectric materials successively deposited and patterned on a substrate via a variety of thin film processes. During operation, the thin-film resistor between the substrate and the conductor leads is rapidly heated by the application of short electrical pulses provided by an external power supply. Consequently, the interface between the printhead and the printing medium, e.g., an ink solution, reaches almost instantaneously a temperature well over 300° C., causing the formation of a vapor bubble just above the printhead surface due to volatilization of the solvent (typically water) of the ink. The process of heating and cooling of the multilayer device is repeated at high frequencies, e.g., several kilohertz, and results in rapid growth and collapse of vapor bubbles, causing corresponding ink droplets to be ejected from a nearby orifice. Such high-temperature, high-frequency operations may lead to a number of stress-related failures in the thin-film structure, especially when the conductor leads have steep, instead of gradual, beveled edges. Since the conductor layer is typically between several thousand angstroms and a few microns thick, sharp conductor edges will be covered inadequately by the subsequently deposited dielectric overcoat layers. Hence a process for patterning conductor leads having a desirable edge profile is vitally important for many solid state devices including thermal ink jet printheads. The optimal sloping angle of the conductor edges in a thermal ink jet printhead may be from a few degrees to about 35°, depending on the lateral resolution of the device.

Several methods are taught in the prior art to make beveled edges in silicon or in films of polysilicon, silicon dioxide and silicon nitride. First, in a "brute-force" approach, a resist is deposited and patterned to provide a mask for isotropic etching. A circular quadrant contour is first produced at the etching endpoint (or breakthrough point), because the center of the isotropic etching is fixed by the edge of the resist. As prolonged etching past endpoint (overetching) progresses, the contour takes the shape of an arc with an increasing radius of curvature. The smallest average sloping angle that can be achieved in this process is 45° at the endpoint. Overetching by an additional 20% of the time to reach the endpoint generates an average tapering angle of 55°; 50% overetching produces an average angle of 70°. Under this approach, the angle near the top edge of the newly formed thin-film structure is always approaching 90°. Such an angle may cause subsequent step coverage problems.

In a second method, the adhesion of the masking material is controlled such that the mask layer continuously lifts from the film being etched as the etch front proceeds, exposing a fresh surface with a moving center of curvature, and maintaining a constant radius of curvature and the profile of a circular quadrant. Again, a problem-prone 90° top edge is often produced. Examples of both the first and the second methods can be found in Brandes et al., "Wall profiles produced during photoresist masked isotropic etching," J. Electrochemical Society, Vol. 120, No. 1, pp. 140-142 (1973). It is noted that the rate-limiting step in the above two techniques is activation-controlled, resulting in edge profiles typical of isotropic etching.

In a third approach, a thinner resist or a resist with poor adhesion to the solid may lift further from the resist/solid/etchant contact line, allowing the etchant to penetrate into the undercut region and producing a profile with a somewhat rounded to edge. The bevel is largely determined by the ratio of the lateral lift-off rate of the resist to the etch rate of the film. However, this guasi-release-layer approach is difficult to control and often fails to generate reproducible results. See, e.g., Vossen et al., "Processes for multilevel metallization," J. Vacuum Sci. Technol., Vol. 11, No. 1, pp. 60-70 (1974).

In the fourth category of methods, a fast-etching "control" layer is deposited on the material to be beveled, prior to coating with the masking resist. Alternatively, the top surface of the material may be treated with wet chemicals, plasma or ion implantation to form a top portion having a higher etch rate than the bulk of the material. In either case, the tapering angle is determined by the ratio of the etch rate of the bulk to that of the fast-etching layer. After the etching process, this taper-control layer must usually be removed. Other complications may also exist. For example, if the control layer for a metal beveling process is another metal, the anodic partial current-potential curve of the sacrificing metal in the etchant must be relatively flat in the region of the rest potential of the bimetallic couple. The grain structure of the sacrificing metal must also be considered.

A typical approach in the fifth category is to deposit several layers of different materials on top of the substrate to be etched. The intermediate layer is selectively etched to form a cantilevered mask on the substrate. The substrate is then etched to form a beveled edge in the undercut region, Again, depending on the materials of the mask, the aforesaid current-potential behavior may have to be taken into account.

As a particular example of the prior art, consider Hoepfner, "Process for the production of etched structures in a surface of a solid body by ionic etching," U.S. Pat. No. 4,092,210, issued May 30, 1978. The mask in a preferred embodiment is composed of two or more layers having different ion etching rates. The layer having the highest etching rate is disposed adjacent to the surface of the solid body to be etched. In another embodiment the mask comprises a single layer of material, such as metal. The rate of disintegration of the masking layer is changed by adding a reactive gas during the ionic etching step. Thus, this technique largely falls in the fourth category set forth above.

As another example of the prior art, consider Shahar et al., "Two-level lithographic mask for producing tapered depth," U.S. Pat. No. 4,938,841, issued Jul. 3, 1990. A "dynamic mask," e.g., a plasma-enhanced vapor-deposited $SiO_2$ layer, is first applied to the surface of a semiconductor material, e.g., a GaAs wafer. A standard mask, e.g., a photoresist layer, is then applied over the dynamic mask and patterned so that its edge laterally defines the bottom of the desired slope. The sample is then immersed in an etchant that etched the dynamic mask faster than the semiconductor material. While the standard mask is not appreciably etched, the dynamic mask is progressively etched laterally, thereby dynamically exposing more of the semiconductor material to etchant and producing a sloped GaAs surface having a tapering angle around 1°. This technique also belongs to the fourth category set forth above.

As still another example of the prior art, consider Keyser, "Etching method," U.S. Pat. No. 4,484,978, issued Nov. 27, 1984. A two-layer etching mask is formed on top of $SiO_2$ layer. The first layer of the etching mask may consist of a thin deposited film, a thin layer of ion damaged $SiO_2$, or a silicone polymer film. A second layer, typically a photoresist layer, is formed on top of the first layer. The first layer is selectively etched to undercut the second mask layer in regions adjacent to an edge. The typical undercut is 100 to 2000 Å high and 2000 to 8000 Å deep. The $SiO_2$ layer is then isotropically chemically etched to form a beveled edge in the undercut region. This technique falls in the fifth category set forth above.

As a further example of the prior art, consider Tamaki et al., "Tapered groove IC isolation," U.S. Pat. No. 4,635,090, issued Jan. 6, 1987. Two insulating films, e.g., $SiO_2$, $Si_3N_4$, $Al_2O_3$, phosphosilicate glass, etc., are formed over the surface of a groove in a bipolar integrated circuit. In a particular embodiment, the top insulating film is selectively etched away, exposing the bottom insulating film, which is in contact with the single-crystal epitaxial silicon layer below. The exposed bottom insulating film is then overetched to leave an overhang of the top insulating film. The length of the overhang is preferably 0.3 to 1.0 $\mu m$. The Si epitaxial layer is then etched isotropically to form a slope of 55°, in line with the Si(111) crystallographic plane. This technique again falls in the fifth category set forth above.

Although the above techniques produce beveled edges under a number of circumstances, few of them are suitable as a wafer-level manufacturing technique for consistently making structures having lithographically defined edge profiles, such as beveled thin-film conductors in a high-performance thermal ink jet printhead. In contrast, the present invention teaches a process for making a multitude of miniature structures on a single substrate, such as a wafer. These structures will have desirable edge profiles, e.g., 5° to 35° slopes that are several to several-tens of microns in length. Additionally, to satisfy specific requirements of a certain application, the several edges of a structure may have either identical or different sloping angles, depending on the specific mask system that is employed to generate the beveled edges.

SUMMARY OF THE INVENTION

Accordingly, it is an object of the present invention to provide a wafer-level manufacturing process for reproducibly patterning lithographically defined structures such that their edges take the shape of pre-defined profiles, e.g., a gradual slope.

It is a further object of the present invention to make a device (e.g., a thermal inkjet printhead) including thin film structures (e.g., conductors) having pre-defined straight beveled edges with a sloping angle between 5° and 35°. The several edges of the structure may have either identical or different sloping angles, depending on the particular requirements of the device.

In accordance with the present invention, two resist layers are successively deposited on top of the target material to be etched. The intermediate resist layer is lithographically patterned beyond the top resist layer, forming recesses. The dimensions of the recesses remain unchanged during the subsequent etching step, thereby enabling the recesses to introduce a diffusion-limiting etching front to the overall etching process, resulting in a lithographically defined structure having pre-defined edge profiles.

In accordance with another embodiment of the invention, a thin first photoresist layer is deposited on top of a conductor film. A second photoresist layer is deposited on top of the first photoresist layer. The second photoresist layer is first patterned, exposing a portion of the underlying first photoresist layer. This first photoresist layer is then developed beyond the second photoresist layer to form recesses in the dual-layer mask. The recesses remain unchanged during the subsequent etching step and function to introduce a diffusion-limiting etching front to the overall etching process, resulting in straight beveled edge profiles having sloping angles between 5° and 35°.

It is an advantage of the present invention to produce a lithographically defined structure having pre-defined beveled edges with gentle sloping angles and rounded top edges.

It is another advantage of the present invention to produce lithographically defined structures having pre-defined edge profiles independent of the crystallinity of the structural material.

It is a further advantage of the present invention to produce uniform lithographically defined structures having pre-defined lateral dimensions and edge profiles through control of etching parameters at the wafer level.

These and other objects, advantages, and features of the present invention will no doubt become apparent to those skilled in the art, and the invention itself will be best understood by reference to the following detailed description read in conjunction with the various accompanying drawings.

DETAILED DESCRIPTION OF THE INVENTION

While this invention may be embodied in many forms, several particular embodiments are schematically shown in FIGS 1–4, with the understanding that the present disclosure is not intended to limit the invention to the embodiments illustrated.

Figure 2:
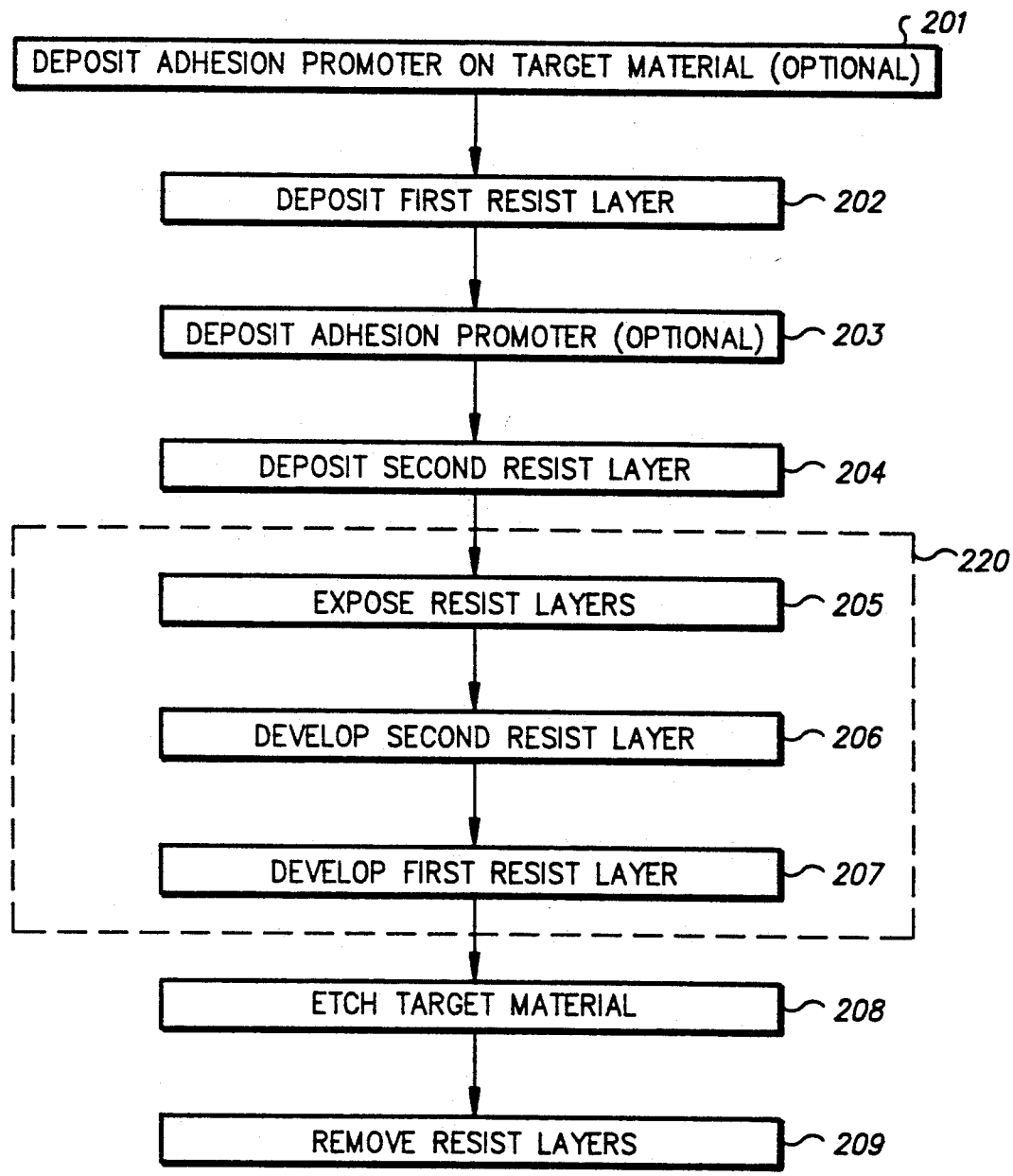
FIG. 2 is a flow-chart representation of an improved process for generating beveled edges.
Figure 3:
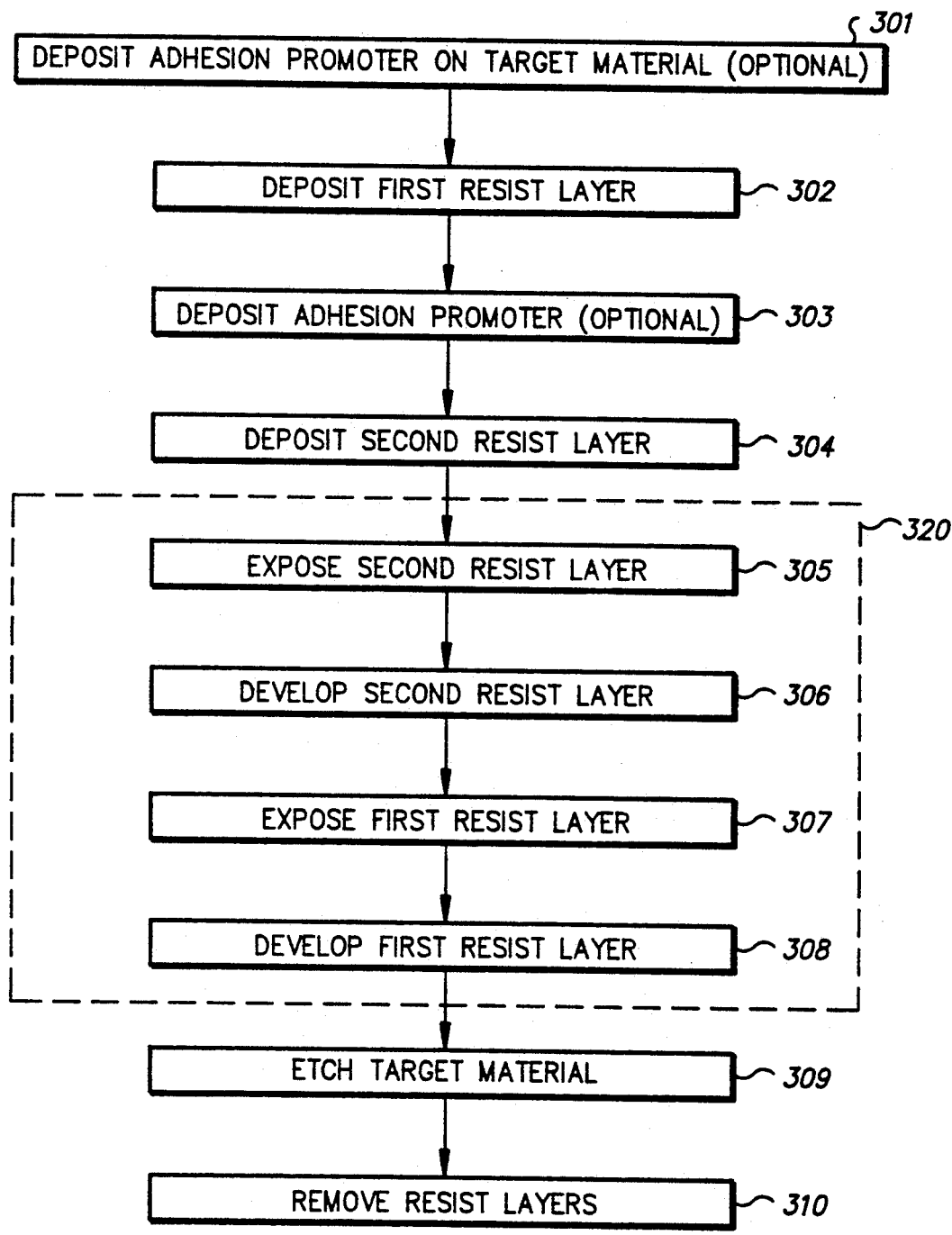
FIG. 3 is a flow-chart representation of another improved process for generating beveled edges.
Figure 4:
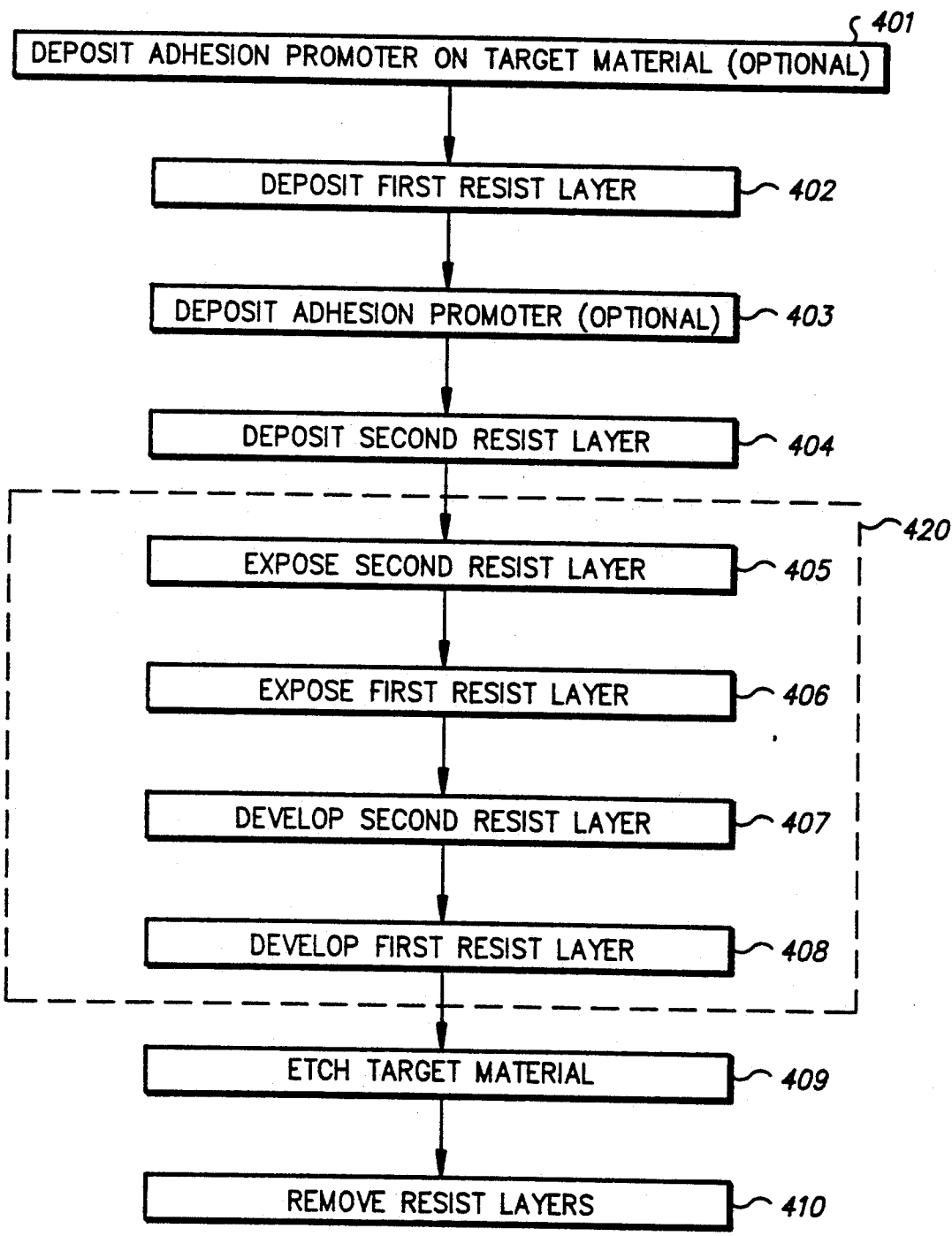
FIG. 4 is a flow-chart representation of still another improved process for generating beveled edges.

According to an aspect of the invention, a patterned resist etching mask with recesses is formed on top of the target material, e.g., a thin film, to be etched. First, two layers of radiation-sensitive resists are successively deposited on top of the target material. The source of radiation may be light, X-rays, electron beams or ion beams. These two layers are then lithographically patterned, such patterning involving imagewise exposure and solvent development of the two layers, to form a resist etching mask with recesses on the target material. Several suitable patterning processes are shown in FIGS. 2–4. The recesses remain essentially unscathed during the subsequent etching process. Because the recesses maintain their structural integrity during the etching process, the mask functions to introduce a diffusion-controlled etching front to the overall etching process. The balance between this diffusion-controlled etching and the activation-controlled etching caused by a well stirred etchant results in straight beveled edge profiles in the target material. Upon completion of the etching process, the resist etching mask is removed from the target material.

Figure 1A:
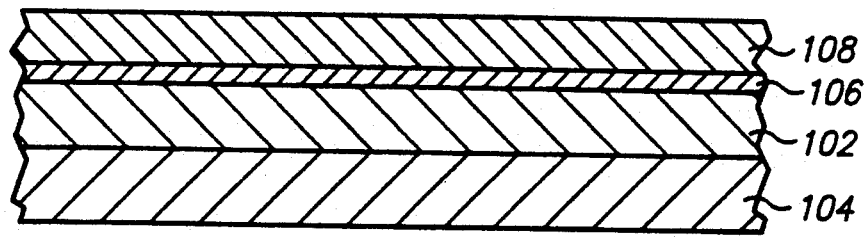
FIG. 1A is a schematic, cross-sectional representation of two resist layers successively deposited on top of a thin film on a substrate.

In one particular embodiment of the invention, typical metallization layers, such as aluminum-4% copper (Al-Cu) thin-film conductors, may be processed to generate essentially straight edges having sloping angles of 5° to 35°. The metallization as deposited may be as thick as a few microns for high-current-density applications. As depicted in FIG. 1A, the target material, i.e., the metallization film 102, is deposited on a substrate 104. The substrate 104 suitably has a reflectance discernible from that of the deposited film 102 to enable the detection of the etching endpoint by a suitable reflection technique described below. In a particular example, the Al-Cu film is conveniently sputter-deposited in an rf-magnetron sputtering process on a pre-oxidized silicon wafer. The oxide layer is thick enough to have a much lower optical reflectivity than the Al-Cu film.

FIG. 1A also shows two photoresist layers 106 and 108 deposited successively on top of the film 102. However, depending on the nature of the film 102 and the photoresist layer 106, an optional layer of an adhesion promoter, such as hydroxymethyldisiloxane (HMDS), may be applied (e.g., spin-coated) on top of the deposited film 102 before the photoresist layer 106 is deposited. This is depicted in FIG. 2 as the step 201.

Referring again to the FIGS. 1 and 2, a solution of the first photoresist is conveniently spin-coated on the Al-Cu film 102 in step 202. Typical examples of a suitable photoresist for layer 106 include, but are not limited to, polydimethylglutarimide (PMGI) based photoresists, polymethylmethacrylate (PMMA) based photoresists, PMGI-PMMA copolymer photoresists, PMA-PMMA copolymer photoresists, and PMGI-PMA copolymer photoresists. The photoresist may be diluted with a suitable solvent to achieve a desirable thickness at a given spinning speed. For instance, one part of a PMGI-based positive photoresist (e.g., XP-5020-SAL available from Shipley Co.), when diluted in two parts of cyclopentanone, results in a PMGI film of 58 nm at 1750 rpm, 51.3 nm at 2100 rpm, and 35 nm at 4000 rpm. More diluted solutions may be used if thinner PMGI layers 106 are desired. To remove extraneous materials such as particulates, the photoresist solution may be pre-filtered through a fine (e.g., 0.2 μm) filter before it is spin-coated on the deposited film 102. The PMGI-coated substrate or wafer is then suitably baked at 140°–170°, preferably at 160°, under nitrogen for about 15 minutes. Again, depending on the nature of the photoresist layers 106 and 108, an optional layer of an adhesion promoter, such as hydroxymethyldisiloxane (HMDS), may be spin-coated on top of the first photoresist layer 106 before the second photoresist layer 108 is deposited. This is depicted in FIG. 2 as the step 203.

After the wafer cools down to room temperature, the second photoresist is conveniently spin-coated on top of the first photoresist layer 106. This is depicted in FIG. 2 as the step 204. Typical examples of a suitable second photoresist include, but are not limited to, positive Novolac-type photoresists (e.g., AZ1375, AZ1350, AZ1350H and AZ1350J, available from Shipley Co., Kodak 747 photoresist from Eastman Kodak Co., and IC-III from Waycoat Co.) The second photoresist may also be diluted with a suitable solvent to achieve the desirable thickness at a given spinning speed. For instance, five parts of AZ1375 diluted in two parts of 2-methoxyethyl ether will form a 1.5-μm photoresist film at 3500 rpm. The photoresist solution may also be pre-filtered through a fine (e.g., 0.2 μm) filter before it is spin-coated. The AZ1375-coated wafer is then suitably baked at 90°–100°, preferably at 95°, for about 30 minutes.

After cooling down to room temperature, the wafer is exposed to radiation. Suitable radiation sources include light (e.g., ultraviolet from mercury/xenon lamps or excimer lasers), X-rays, electron beams and ion beams. Conveniently, the wafer is imagewise exposed to ultraviolet (uv) at a suitable intensity in a mask aligner containing a photolithographic mask. This is depicted in FIG. 2 as the step 205. By choosing photoresist materials having suitable photosensitivities, this exposure step 205 preferably overexposes the first resist layer 106, in case both layers 106 and 108 are made of positive photoresists. Alternatively, negative photoresists may be suitably chosen such that the step 205 preferably underexposes the first photoresist layer 106. In one embodiment of the invention, the next step (step 206) involves solvent development to develop images in the second photoresist layer 108. Depending on the characteristics of the materials, the first photoresist layer 106 may also be partly dissolved, exposing partially the metal film 102.

This is acceptable so long as the first photoresist layer 106 is not dissolved beyond the pre-determined boundaries of the recesses to be formed. In the example in which the first and second photoresist layers (106 and 108) are made of PMGI and AZ1375, respectively, a developer with the composition of two parts of AZ2401 (a KOH-based photodeveloper available from Shipley Co.), four parts of sodium silicates (such as Microposit Developer Concentrate available from Shipley Co.) and fifteen parts of water may be used in the step 206.

Figure 1B:
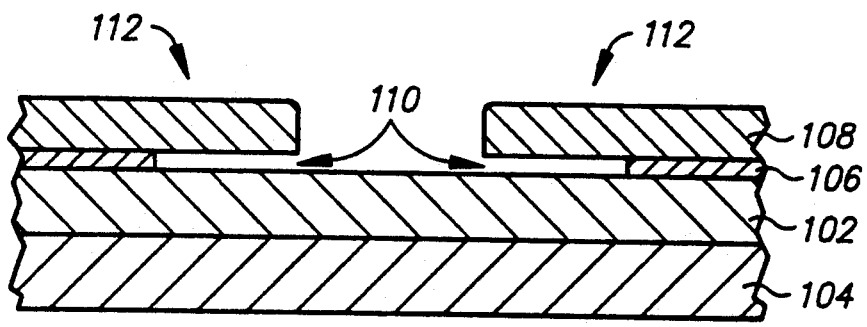
FIG. 1B is a schematic, cross-sectional representation a patterned dual-resist mask on the thin film of FIG. 1A prior to an etching process.

At the next step of this embodiment of the invention (step 207), a second developer is used to generate a recess 110 in the first photoresist layer 106 to form the dual-resist mask 112 having the desirable geometry, as depicted in FIG. 1B. For the example with the first photoresist layer 106 made of PMGI and the second photoresist layer 108 made of AZ1375, a developer having the composition of three parts of Az2401, thirty-two parts of sodium silicates (such as Microposit Developer Concentrate available from Shipley Co.), and eighty parts of water may be used to develop the PMGI layer 106. Thus, a resist mask 112 is formed by a lithographical patterning step collectively depicted as the step 220 in FIG. 2.

Figure 1C:
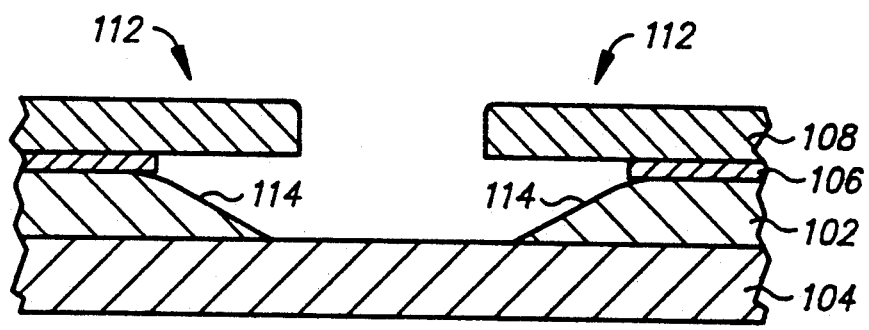
FIG. 1C is a schematic, cross-sectional representation of the dual-resist mask of FIG. 1B and the beveled thin film after the etching process.

Referring to FIG. 1C, the metal film, with the dual-layer photoresist mask 112 on top, is etched in an etching environment which is uniform and activation-controlled anywhere outside the recess 110. An endpoint detector based on, for example, the difference in optical (visible, ultraviolet or infrared) reflectances between the substrate surface (e.g. the aforesaid oxide layer) and the metal film 102, is used to detect the endpoint (breakthrough point). In some cases, it may be desirable to overetch beyond the endpoint to achieve uniform etching across the substrate or wafer. For best results, the extra time of overetching may vary from 0 to 40% of the time to reach the endpoint (i.e., 0–40% overetching). This is summarized in FIG. 2 as the step 208. After the etching, the wafer is immediately rinsed by de-ionized water sprays and dried by air.

Consider again the example in which PMGI and AZ1375 are processed to form an etching mask 112 on top of a 1-$\mu$m thick Al-Cu film 102. Generally, the PMGI layer 106 is so thin as to maintain diffusion-controlled etching in the recess 110. Typically, the PMGI layer 106 is no more than 80 nm thick, but preferably 20–60 nm thick; the thickness of the AZ1375 layer 108 is typically around 1 to 2 microns. A deep recess 110 is generated in the dual-resist mask 112. For a 1-$\mu$m thick metal film 102, a recess typically 1.5 to 12 microns deep is desirable. For thicker metal film 102, longer recess may be desired. Under conditions of uniform, well-stirred bulk etching, the sloping angle of the final metal film edge 114 is essentially determined by the depth of the recess 110 and the thickness of the metal film 102. To obtain straight beveled edges, the depth of the recess 110 is preferably greater than the thickness of the metal film 102. For example, a dual-resist mask 112 having a 1.5 $\mu$m deep recess 110 on top of a 1-$\mu$m thick metal film 102 will generate an edge 114 having a sloping angle of approximately 35° A dual-resist mask 112 having a 12 $\mu$m deep recess 110 on top of a 1-$\mu$m thick metal film 102 will generate an edge 114 having a sloping angle of approximately 5°. In the specific application of thermal ink jet printhead, a 10° slope can be generated by using a dual-resist mask 112 having a 6 $\mu$m deep recess 110. The sloping angle depends, to a much less extent, on the degree of overetching (typically 0–40%).

To maintain a uniform, activation-controlled bulk etching outside the recess area, the etching process is executed in a well stirred environment generated by, for example, a spin/spray etcher wherein spray pressure, spin speed, etchant composition and etching temperature are separately and conveniently controlled. A suitable etcher is the Model SPW 612-A spin etcher made by Dainippon Screen Manufacturing Co. Referring again to the aforesaid example involving the Al-Cu metal film, a suitable etchant is a mixture of 80 parts of phosphoric acid (70.5%), 25 parts of acetic acid (99.8%), 5 parts of nitric acid (70%) and 6 parts of water. The etching temperature is kept between 50° and 60° C.; spray pressure, 0.5–1.0 kgf/cm$^2$; spin speed, 500–1000 rpm. The etchant does not appreciably attack or dissolve the photoresist materials, so that the recess remains essentially unscathed during the etching process. Because the recess maintains its structural integrity, the mask functions to introduce a diffusion-controlled etching front throughout the etching process, resulting in straight beveled edge profiles.

Finally, at the step 209, both photoresists are readily removed from the metal film 102 by the use of suitable solvents known to those skilled in the art. For example, AZ1375 can be removed in an ultrasonic bath of acetone. PMGI can be removed by soaking the wafer in 1-methyl-2-pyrrolidinone at 60° C. for 2 hours. The wafer is finally cleaned by suitable solvents, such as ultrasonic acetone (1 min), isopropyl alcohol (1 min) and deionized water.

In another particular embodiment of the invention, typical metallization layers similar to those in the above-identified embodiment may be processed to generate essentially straight beveled edges. The deposition steps 301–304 are essentially the same as steps 201–204 of the above-identified embodiment. After cooling down to room temperature, the wafer is exposed to radiation from, e.g., a uv source having a characteristic wavelength, in a mask aligner containing a lithographic mask. If both photoresist films are formed by positive photoresists, the photoresists can be chosen according to their photosensitivities such that the first photoresist layer 106 is preferably underexposed. This is depicted in FIG. 3 as the step 305. At the next step 306, a developer is used to develop patterns in the second photoresist layer 108. Depending on the characteristics of the material, the first photoresist layer 106 may also be partly dissolved, exposing partially the metal film 102. This is acceptable so long as the first photoresist layer 106 is not dissolved beyond the pre-determined boundaries of the recesses to be formed.

At the step 307, a second exposure is executed to form a latent image in the first photoresist layer 106. Such latent image defines the post-development geometry of the recesses 110 in the first photoresist layer 106. If the second photoresist layer 108 is made of a material which loses its photosensitivity after the development step 306, the wafer may again be exposed to the same radiation source as above, such that the first photoresist layer 106 is exposed beyond the dimensions of the same lithographic mask as the one used at the step 305 (i.e., the layer 106 is laterally "overexposed.") The wafer may also be exposed to the same radiation source as above in a mask aligner containing a second lithographic mask which lithographically defines the post-development geometry of the recesses 110 in the first photoresist layer 106. In the latter way, this second exposure may be used to define recesses of varying depths, such that the final metal film structure after etching comprises several edges having either identical or different sloping angles. Alternatively, if the second photoresist layer 108 is made of a material which is still photosensitive after it has been developed in the step 306, this second exposure step 307 is suitably executed at a second characteristic wavelength which exposes only the first photoresist layer 106, but not the second photoresist layer 108.

A second developer is used in the step 308 to generate recesses 110 in the first photoresist layer 106. Thus, a dual-resist mask 112 having the desirable geometry, as depicted in FIG. 1B, is formed by a lithographical patterning step collectively depicted as the step 320 in FIG. 3.

Referring to FIG. 1C, the metal film, with the two-layer photoresist mask 112 on top, is etched in an etching environment which is uniform and activation-controlled anywhere outside the recess 110. Uniform etching results across the substrate or wafer are guaranteed by overetching for a pre-determined extra time beyond the etching endpoint. This is summarized in FIG. 3 as the step 309. After the etching, the wafer is immediately rinsed by de-ionized water sprays and dried by air. Finally, at the step 310, both photoresists are removed by the use of suitable solvents.

In still another particular embodiment of the invention, typical metallization layers similar to those in the above-identified embodiments may be processed to generate essentially straight edges. The deposition steps 401-404 are essentially similar to steps 201-204 or 301-304 of the respective above-identified embodiments. After cooling down to room temperature, the wafer is exposed to radiation from, e.g., a uv source having a characteristic wavelength, in a mask aligner containing a lithographic mask, to form a latent image in the second photoresist layer 108. This exposure step preferably underexposes the first photoresist layer 106. This is depicted in FIG. 4 as the step 405.

At the step 406, a second exposure is executed to form a latent image in the first photoresist layer 106. Such latent image defines the post-development geometry of the recesses 110 in the first photoresist layer 106. A suitable way for achieving this is to expose the wafer to a radiation source having a second characteristic wavelength different from the one in the step 405. This second radiation defines by lateral overexposure the post-development recesses 110 in the first photoresist layer 106, but does not affect appreciably the already-exposed second photoresist layer 108. Alternatively, a second lithographic mask may be used in conjunction with the above second radiation source to define recesses of varying depths, such that the final metal film structure after etching comprises several edges having either identical or different sloping angles.

A developer is used at the step 407 to develop images in the second photoresist layer 108. After adequate rinsing and drying, another developer is used at the step 408 to develop the latent images and to form the recess 110 in the first photoresist layer 106. Depending on the characteristics of the photoresist materials, the developer used to dissolve the first photoresist layer 106 may be the same as the developer used to dissolve the second photoresist layer 108. In such cases the two development steps 407 and 408 can be merged to form a single development step. A dual-resist mask 112 having the desirable geometry, as depicted in FIG. 1B, is formed by the lithographical patterning step collectively depicted as the step 420 in FIG. 4.

Referring to FIG. 1C, the metal film, with the two-layer photoresist mask 112 on top, is etched in an etching environment which is uniform and activation-controlled anywhere outside the recess 110. Uniform etching results across the substrate or wafer are guaranteed by overetching for a pre-determined extra time beyond the etching endpoint. This is summarized in FIG. 4 as the step 409. After the etching, the wafer is immediately rinsed by de-ionized water sprays and dried by air. Finally, at the step 410, both photoresists are removed by the use of suitable solvents.

It is noted that the improved beveling processes of the present invention produce in some cases a slightly rounded top edge in the lithographically defined thin-film edge 114, especially when the adhesion between the thin film 102 and the first photoresist layer 106 is diminished. In the aforesaid example concerning the use of PMGI and AZ1375 on top of the Al-Cu film, an adhesion promoter is preferably applied between the two photoresist layers but not between the Al-Cu film and the PMGI layer. A sloped thin-film structure with a rounded top edge will further alleviate any step coverage problems. This beneficial result may be caused by the penetration of the etchant into the interface region and the resultant etching of the top portion of the thin film.

It is also noted that the present invention does not compromise line-width control. In the aforesaid example involving Al-Cu thin-film conductors, a constant overetch will keep the variations in conductor length within 2%, which is more than adequate for many applications including thermal ink jet printing.

It is further noted that the present invention is applicable for the etching of any polycrystalline or amorphous materials. For example, a pure aluminum conductor or a polysilicon resistor can also be beveled by the present process.

Those skilled in the art will recognize that the foregoing description has been presented for the purposes of illustration and description only. It is not intended to be exhaustive or to limit the invention to the precise forms disclosed, and obviously many modifications and variations are possible in light of the above teachings. Thus, the embodiments set forth herein are presented in order to best explain the principles of the present invention and its practical applications to thereby enable others skilled in the art to best utilize the present invention in various embodiments, modifications and equivalents as are suited to the particular use contemplated.

What is claimed is:

1. A method of forming beveled edges in a target material comprising the steps of:
   a. depositing a first layer of a first radiation-sensitive resist material on a surface of said target material;
   b. depositing a second layer of a second radiation-sensitive resist material on top of said first layer;
   c. patterning said first and second layers to form a plurality of recesses in said first layer and to expose a portion of said surface of said target material; and
   d. etching said target material to form said beveled edges in said target material.

2. A method of forming beveled edges in accordance with claim 1, wherein said patterning step further comprises the following steps:
   1) an exposure step;
   2) a first development step to develop said second resist material; and 3) a second development step to develop said first resist material to form said recesses.

3. A method of forming beveled edges in accordance with claim 1, wherein said patterning step further comprises the following steps:
1) a first exposure step to expose said second resist material;
2) a first development step to develop said second resist material;
3) a second exposure step to expose said first resist material; and
4) a second development step to develop said first resist material to form said recesses.

4. A method of forming beveled edges in accordance with claim 1, wherein said patterning step further comprises the following steps:
1) a first exposure step to expose said second resist material;
2) a second exposure step to expose said first resist material;
3) a first development step to develop said second resist material; and
4) a second development step to develop said first resist material to form said recesses.

5. A method of forming beveled edges in accordance with claim 3, wherein
said first exposure step involves a first lithographic mask; and
said second exposure step involves a second lithographic mask to lithographically define the geometry of said recesses.

6. A method of forming beveled edges in accordance with claim 4, wherein
said first exposure step involves a first radiation source; and
said second exposure step involves a second radiation source and laterally overexposes said first resist material.

7. A method of forming beveled edges in accordance with claim 4, wherein
said first exposure step involves a first radiation source and a first lithographic mask; and
said second exposure step involves a second radiation source and a second lithographic mask to lithographically define the geometry of said recesses.

8. A method of forming beveled edges in accordance with claim 2, wherein each said recess is generated to a depth greater than the thickness of said target material.

9. A method of forming beveled edges in accordance with claim 3, wherein each said recess is generated to a depth greater than the thickness of said target material.

10. A method of forming beveled edges in accordance with claim 4, wherein each said recess is generated to a depth greater than the thickness of said target material.

11. A method of forming beveled edges in accordance with claim 5, wherein each said recess is generated to a depth greater than the thickness of said target material.

12. A method of forming beveled edges in accordance with claim 6, wherein each said recess is generated to a depth greater than the thickness of said target material.

13. A method of forming beveled edges in accordance with claim 7, wherein each said recess is generated to a depth greater than the thickness of said target material.

14. A method of forming beveled edges in accordance with claim 2, wherein said resist materials are selected from a group consisting of polydimethylglutarimide (PMGI), polymethylmethacrylate (PMMA), polymethylmethacrylic acid (PMA), PMGI-PMMA copolymers, PMA-PMMA copolymers, and PMGI-PMA copolymers.

15. A method of forming beveled edges in accordance with claim 3, wherein said resist materials are selected from a group consisting of polydimethylglutarimide (PMGI), polymethylmethacrylate (PMMA), polymethylmethacrylic acid (PMA), PMGI-PMMA copolymers, PMA-PMMA copolymers, and PMGI-PMA copolymers.

16. A method of forming beveled edges in accordance with claim 4, wherein said resist materials are selected from a group consisting of polydimethylglutarimide (PMGI), polymethylmethacrylate (PMMA), polymethylmethacrylic acid (PMA), PMGI-PMMA copolymers, PMA-PMMA copolymers, and PMGI-PMA copolymers.

17. A method of forming beveled edges in accordance with claim 5, wherein said resist materials are selected from a group consisting of polydimethylglutarimide (PMGI), polymethylmethacrylate (PMMA), polymethylmethacrylic acid (PMA), PMGI-PMMA copolymers, PMA-PMMA copolymers, and PMGI-PMA copolymers.

18. A method of forming beveled edges in accordance with claim 6, wherein said resist materials are selected from a group consisting of polydimethylglutarimide (PMGI), polymethylmethacrylate (PMMA), polymethylmethacrylic acid (PMA), PMGI-PMMA copolymers, PMA-PMMA copolymers, and PMGI-PMA copolymers.

19. A method of forming beveled edges in accordance with claim 7, wherein said resist materials are selected from a group consisting of polydimethylglutarimide (PMGI), polymethylmethacrylate (PMMA), polymethylmethacrylic acid (PMA), PMGI-PMMA copolymers, PMA-PMMA copolymers, and PMGI-PMA copolymers.

* * * * *